Figure 1:
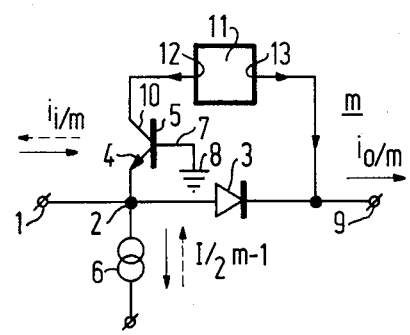

United States Patent [19]

van de Plassche

[11] Patent Number: 4,574,270
[45] Date of Patent: Mar. 4, 1986

[54] ANALOG-TO-DIGITAL CURRENT CONVERTER

[75] Inventor: Rudy J. van de Plassche, Sunnyvale, Calif.

[73] Assignee: U.S. Philips Corporation, New York, N.Y.

[21] Appl. No.: 498,617

[22] Filed: May 27, 1983

[30] Foreign Application Priority Data

Jun. 8, 1982 [NL] Netherlands ............... 8202301

[51] Int. Cl.⁴ ............................................. H03K 13/02
[52] U.S. Cl. ................................................. 340/347 AD
[58] Field of Search ..................... 340/347 AD, 347 M

[56] References Cited

U.S. PATENT DOCUMENTS

| | | | |
|---|---|---|---|
| 4,275,386 | 6/1981 | Michel et al. | 340/347 AD |
| 4,295,123 | 10/1981 | Reid | 340/347 AD |
| 4,306,224 | 12/1981 | Geller et al. | 340/347 AD |
| 4,325,054 | 4/1982 | van de Plassche | 340/347 AD |
| 4,379,285 | 5/1983 | Dooley | 340/347 AD |
| 4,384,274 | 5/1983 | Mao | 340/347 AD |

Primary Examiner—David Smith, Jr.
Attorney, Agent, or Firm—Robert T. Mayer; Bernard Franzblau

[57] ABSTRACT

An analog-to-digital current converter comprises n series-connected stages which each provide one bit of the Gray code. For this purpose each stage m derives a difference current from the input current ($i_{i/m}$), which is the output current ($i_{0/m-1}$) of the preceding stage, and a reference current ($I/2^{m-1}$) from a source (6). This difference current flows to the output (a) of the stage m ($i_{o/m}$) either via a diode (3) or via a current (11) depending on its direction. Conduction of the diode (3) or of the current-mirror circuit (11) is used for the bit indication.

This results in a very fast analog-to-digital converter with few components and a high accuracy and resolution.

18 Claims, 6 Drawing Figures

ANALOG-TO-DIGITAL CURRENT CONVERTER

The invention relates to an analogue-to-digital current converter comprising n stages, which each supply one bit and which are arranged in series, for which purpose an input is connected to an output of a preceding stage and a node in each stage is connected (1) to the input, (2) to a first diode whose other end is connected to the output, (3) to the emitter of a first transistor in common-base arrangement, and (4) to a reference-current source which is arranged in such a way that for an input current at the input a difference current is produced at the node, said emitter carrying the difference current if this current has the one current direction and the first diode carrying the difference current if this current has the other current direction.

Such an analogue-to-digital current converter is known from U.S. Pat. No. 4,179,687. Each stage determines the difference between the input current of the stage and the reference current. For one polarity of this difference current, this current is drained to a current sink and may actuate a bit-indicator circuit, whereas for the other polarity a diode circuit transfers the difference current to the next stage, which performs a similar operation.

For a linear relationship between the current to be measured and the bit indication all the reference currents should be equal. The digital representation which is obtained is eminently suitable for driving a bar indicator. The resulting scale is divided into n parts and the resolution is consequently 1 to n, which is obtained by the use of n stages. In order to obtain a binary digital representation a coding circuit must be used, which becomes very complex as n increases.

It is an object of the invention, starting from the known current-overflow principle described in the foregoing, to obtain a digital conversion of a current by means of n stages in a binary code known as the Gray-code, so that the resolution is: 1 to $2^n$.

To this end the analogue-to-digital current converter in accordance with the invention is characterized in that a current-mirror circuit is connected to the collector of the first transistor and to the output so that this output can carry an output current whose value is substantially equal to that of the collector current of the first transistor and whose direction corresponds to the forward direction of the first diode.

This has the advantage that a current can be digitized accurately, by means of a few stages, that each stage is of very simple construction and that a converter is obtained which operates very quickly.

It should be noted that analogue-to-digital current converters comprising n stages for a Gray-code are known. For example, British Pat. No. 1,266,962 describes a converter in which each binary stage comprises a diode rectifier bridge, a voltage comparator circuit and current-voltage converters. These components render each stage comparatively intricate and slow. A similar circuit arrangement is described in U.S. Pat. No. 3,984,832.

A converter which is capable of converting a voltage into an n-bit Gray-code by means of n stages is known from U.S. Pat. No. 3,587,089. As already stated, circuit arrangements comprising voltage comparators are slow in comparison with circuit arrangements in which only a few components carry current, as in the known analogue-to-digital current converter mentioned in the opening paragraph and in the converter in accordance with the invention.

One embodiment of the invention employs a current mirror, which is known per se, so that a simple very fast stage is obtained. Moreover, it is readily possible to add a bit-indication circuit.

A further embodiment employs an operational amplifier with two feedback resistors. This results in a current mirror circuit which can be adjusted very accurately. Moreover, the output of the amplifier can also provide the bit indication.

When, in an embodiment of a converter in accordance with the invention, the direction of the reference current in the first stage can be inverted it is possible to measure currents of either polarity. Moreover, the bit indication should be coupled thereto by means of an inverter circuit which can be switched in or out.

A bit-indication circuit can be operated by detecting whether the first diode in each stage conducts. Such bit-indication circuits are known from U.S. Pat. No. 3,735,390, FIG. 2 and FIG. 4.

Figure 2:
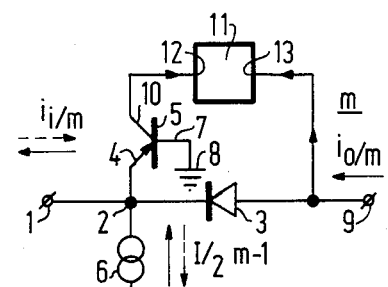
Figure 3:
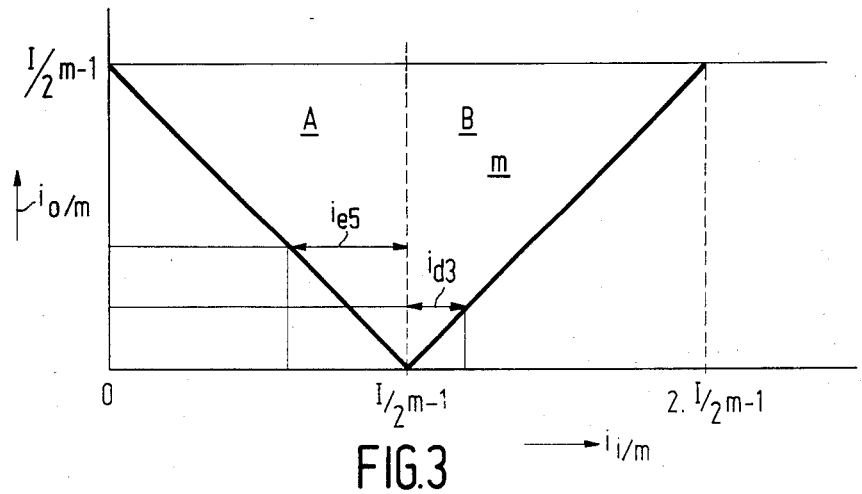
Figure 4:
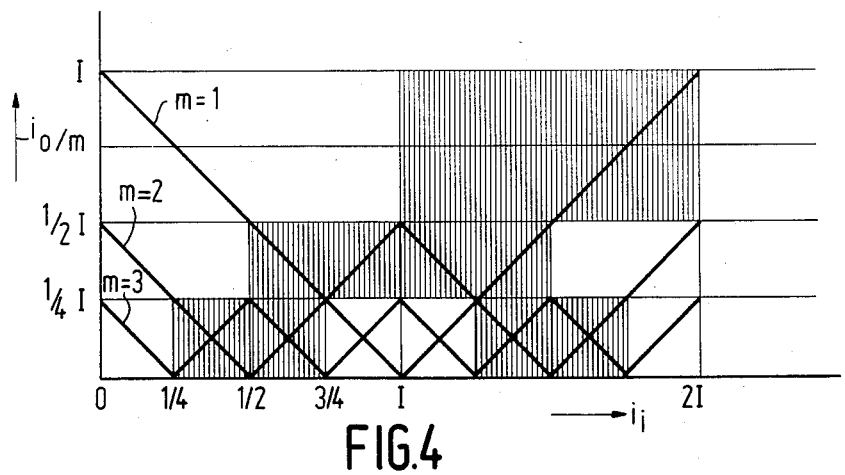
Figure 5:
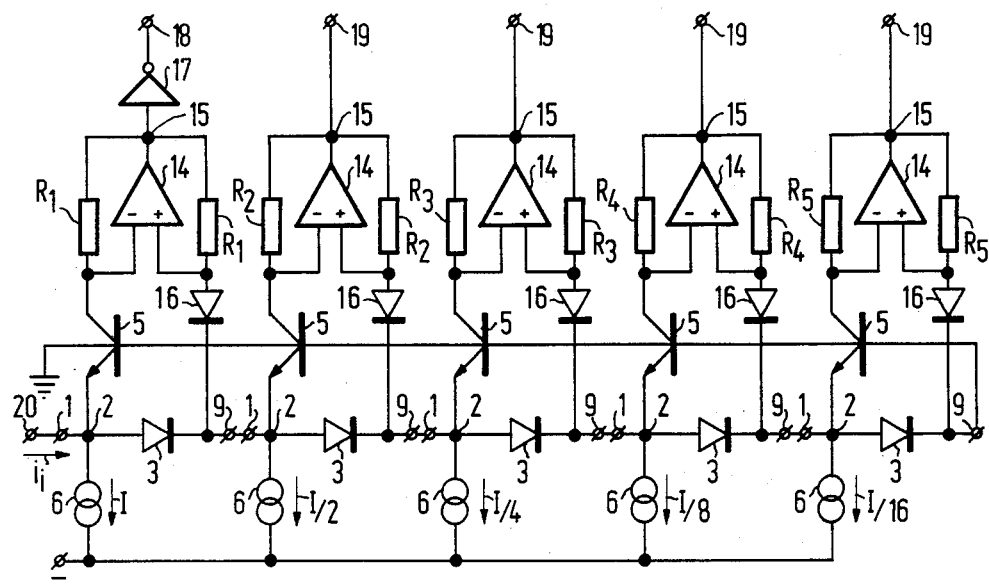
Figure 6:
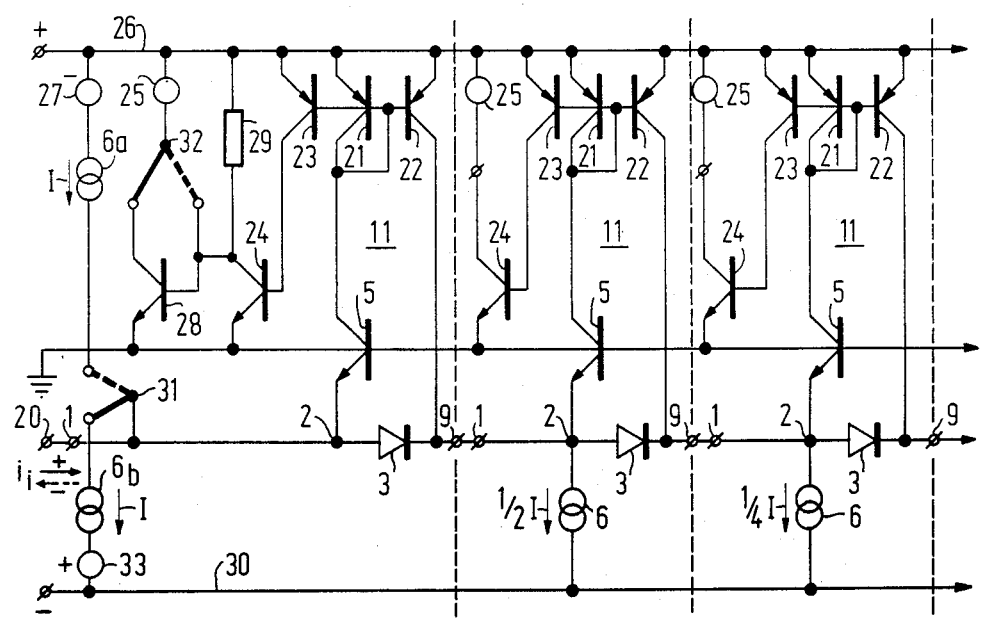

The invention will now be described in more detail, by way of example, with reference to the drawing, in which:

FIG. 1 shows the block diagram of one of the n stages,

FIG. 2 is the block diagram as shown in FIG. 1 with inverted current directions and forward directions of the semiconductors, FIG. 3 shows the relationship between the input current and the output current of the $m^{th}$ stage, FIG. 4 shows the relationship between the input current of a three-stage converter and the output current of each of the 3 stages, FIG. 5 is the block diagram of a 5-stage embodiment comprising a resistive current mirror, and FIG. 6 is the block diagram of an embodiment of the invention with current mirrors and polarity inversion.

FIG. 1 shows one stage m of the n stages by means of which the analogue-to-digital current converter in accordance with the invention can be constructed. The input current $i_{i/m}$ is applied to the node 2, to which the first diode 3, the emitter 4 of a transistor 5 and a reference-current source 6 are connected. The base 7 of transistor 5 is connected to a reference potential 8, for example ground. Further, the diode 3 is connected to an output 9 of the stage m. A current-mirror circuit, represented as a block 11, is connected to the collector 10 of transistor 5 and to output 9. This circuit ensures that a current at the input 12 is substantially identical to a current at the output 13. The description of FIG. 1 also applies to FIG. 2.

In FIG. 2 the current directions and the forward directions of the semiconductors are inverted relative to those in the diagram shown in FIG. 1. Transistor 5 in FIG. 1 is of the npn-type, the input current $i_{i/m}$ is positive and has the same direction as the forward direction of diode 3 and the current direction of the output current $i_{o/m}$. Consequently, the circuit 11 supplies current to transistor 5 or to output 9, as the case may be. The transistor 5 in FIG. 2 is of the pnp-type, the input current $i_{i/m}$ is negative, i.e. input 1 supplies current. Output 9 receives the current $i_{o/m}$, while the circuit 11 also receives a current.

The operation of the circuit arrangements shown in FIG. 1 and FIG. 2 can be explained simply by means of a diagram.

This diagram is shown in FIG. 3. The input current $i_{i/m}$ may have the value 0 to $2 \cdot I/2^{m-1}$. This depends on the value of the reference current from source 6, which for the $m^{th}$ stage is equal to $I/2^{m-1}$. In the range A in FIG. 3 this current is divided between the input current $i_{i/m}$ and the emitter current $i_{e5}$ of transistor 5. The output current $i_{o/m}$ is equal to $i_{e5}$. In the range B in FIG. 3 the input current $i_{i/m}$ ranges between the values $I/2^{m-1}$ and $2 \cdot I/2^{m-1}$. The diode 3 conducts the difference current $i_{d3}$ between the input current $i_{i/m}$ and the reference current $I/2^{m-1}$. The output current $i_{o/m}$ is then equal to $i_{d3}$.

FIG. 4 shows a graph of the output currents $i_{o/m}$ of each of the 3 series-connected stages of an analogue-to-digital converter whose input current $i_i$, which ranges from 0 to 2I, is to be converted. The value of the current from the current source of the first stage is I, that of the second stage I/2 and that of the third stage is I/4. When it is assumed that a bit-indication circuit supplies a logic "1" for each stage in the range A of FIG. 3, i.e. when the current-mirror circuit supplies a current, the shaded portion in FIG. 4 shows which bits have the value "1" for specific input currents. An exception is to be made for the first stage. The bit-indication circuit of this stage requires the use of an inverter circuit because for zero input current the entire reference current I should be supplied by the current-mirror circuit, which current in its turn functions as the input current for the second stage, which thus reaches its maximum current $(2 \cdot I/2^{m-1})$. The same applies to the next stages. The currents conducted by the first diode and the current mirror circuit in the first stage and those in all subsequent stages can be made to correspond by inverting the direction of the input current and of the reference current I. This is indicated by a dashed arrow in FIG. 1 and in FIG. 2. These Figures clearly show that this input current should have a value greater than the reference current I for signalling the most significant bit because the difference is then supplied by the current-mirror circuit 11, which can thus indicate that the most significant bit is "1".

FIG. 5 shows a five-bit converter. For the current-mirror circuit each stage comprises an operational amplifier 14 with 2 identical resistors $R_1$, $R_2$ to $R_5$. The resistors may be of equal value in the different stages but alternatively they may increase in value, for example in accordance with a binary function, i.e. $R_5=2R_4$, $R_4=2R_3$, $R_3=2R_2$ and $R_2=2R_1$. As a result of this each amplifier 14 will be driven over the same voltage range.

The converter shown in FIG. 5 operates as follows. The input current $i_i$ is applied to the input 20 of the converter and has a value between 0 and 2I. The input 20 is connected to input 1 of the first stage. If the value of this input current is smaller than I, the difference is supplied by transistor 5. In the case of a very high current-gain factor it may be assumed that the collector current of transistor 5 is equal to the difference. This collector current produces a voltage drop across the resistor $R_1$, which is connected to the negative input of the amplifier and to the output 15. This output is also connected via a resistor $R_1$ to the positive input of the amplifier 14. The voltage drops across these two resistors should be equal, so that a current will flow from output 15 to output 9 through the resistor $R_1$, the value of this current being equal to the difference current of node 2, if necessary by adjusting the two resistors $R_1$ relative to each other. One or a plurality of diodes 16 or a zener diode are arranged between the positive input and the output 9 in order to provide a suitable base-collector voltage for the transistor 5 of the first stage when the transistor 5 of the next stage conducts. The positive voltage now appearing on output 15 is supplied to the bit output 18 via an inverter 17 as a "0" level. An input current from 0 to I in the first stage causes an output current of I to 0 to flow from output 9 of the first stage to input 1 of the next stage via the current-mirror circuit.

If the input current of the first stage ranges between I and 2I, the reference current I is subtracted from this input current and the difference is applied to output 9 via diode 3. The current of the value I to 2I results in an output current 0 to I of the first stage.

Thus, it is found that the second stage receives an input current between 0 and I. If the input current value is smaller than $\frac{1}{2}$I the second stage current-mirror circuit is conductive and if the value is greater than $\frac{1}{2}$I diode 3 conducts. This means that the diode conducts when the input current of the converter is between 0 and $\frac{1}{2}$I, the input current of the second stage then being between I and $\frac{1}{2}$I, and when the input current of the converter is between $1\frac{1}{2}$I and 2I, the input current of the second stage being $\frac{1}{2}$I to I.

In both cases the most significant bit but one is "0", which results in the current mirror circuit being turned off and in a low level corresponding to "0" on the bit output 19.

The input of the third stage receives a current between 0 and $\frac{1}{2}$/I and supplies a current between 0 and $\frac{1}{4}$I to the fourth stage.

FIG. 6 shows the first, the second and the third stage of an analogue-to-digital current converter with polarity inversion and current mirrors.

The current-mirror circuit 11 comprises two transistors 21 and 22 which together form a current mirror, the collector current of transistor 5 flowing through the transistor 21 which is arranged as a reference diode, so that transistor 22 supplies a proportional, in the present case substantially equal, current to the output 9. For an accurate adjustment resistors may be arranged between the emitters and the power-supply rail 26. A bit indication transistor 23 is coupled to the current mirror. As the bit-indication circuit a transistor 24 and a current indicator, for example a LED, are provided.

For the polarity reversal the first stage comprises a current source 6a, which is adapted to supply a current I to the node 2 and which for this purpose is connected to the positive power-supply rail 26, if desired via a current indicator 27 which, when the source 6a conducts, indicates that currents of negative polarity can be measured, as indicated by the dashed arrow near input 20 for the current $i_i$. The bit indicator 25 is connected directly to the transistor 24. For measuring currents of the other polarity, indicated by a solid arrow and a plus sign for $i_i$, the indicator 25 is connected to a transistor 28, whose base is connected to the collector output of transistor 24 and to a base resistor 29. The transistor 28 forms an inverter circuit for the bit indication. Moreover, the source 6a has been replaced by the source 6b, which is arranged in such a way between the node 2 and the negative power-supply rail 30 that a current I is available on node 2.

The polarity reversal and the change-over of the bit indicator in the first stage are symbolically represented in FIG. 6 by a switch 31 and a switch 32, whose interconnection in solid lines corresponds to the solid arrow $i_i$ and whose dashed interconnection corresponds to the dashed arrow $i_f$. For the indication of the positive polarity a current indicator 33 may be arranged in series with the source 6b.

It is to be noted that in the description and in the claims the components are referred to as "diodes" and "transistors".

It will be evident to those skilled in the art that "diode" is to be understood to mean any device which upon application of a suitable voltage conducts current in the one direction and blocks current in the other direction and that "transistor" is to be understood to mean not only the bipolar version but any other semiconductor element having a main current path with two connection electrodes and one control electrode for controlling the current in the main current path, as for example junction or MOS-FET's, in which case base should read "gate", emitter should read "source", and collector should read "drain".

What is claimed is:

1. An analogue-to-digital current converter comprising n stages which each supply one bit and are arranged in series with an input of a stage being connected to an output of a preceding stage, a node in each stage being connected (1) to the input of that stage, (2) to one end of a first diode, whose other end is connected to the output of that stage, (3) to the emitter of a first transistor in common-base arrangement, and (4) to a reference-current source connected in such a way that for an input current at the input a difference current is produced at the node, said emitter carrying the difference current if said current has the one current direction and the first diode carrying the difference current if said current has the other current direction, characterized in that a current-mirror circuit is connected to the collector of the first transistor and to the output of that stage so that said output carries an output current of a value substantially equal to that of the collector current of the first transistor and in a direction that corresponds to the forward direction of the first diode.

2. An analogue-to-digital current converter as claimed in claim 1, characterized in that the current-mirror circuit comprises at least two transistors, whose emitters are each coupled to a power-supply source, whose bases are interconnected, and one of which has a collector connected to the interconnected bases and to the collector of the first transistor and the other transistor has a collector connected to the output of its respective stage.

3. An analogue-to-digital current converter as claimed in claim 1, characterized in that the current mirror circuit comprises an operational amplifier having an output connected to two substantially identical resistors, one input connected to the one resistor and to the collector of the first transistor, and another input connected to the other resistor and, via at least one diode, to the output.

4. An analogue-to-digital current converter as claimed in claim 1 wherein a bit-indication circuit is connected to the first diode.

5. An analogue-to-digital current converter as claimed in claim 2, characterized in that the current-mirror circuit comprises a bit-indication transistor having an emitter connected to the power supply source and a base is connected to the said interconnected bases.

6. An analogue-to-digital current converter as claimed in claim 3, further comprising a bit-indication circuit connected to the output of the operational amplifier.

7. An analogue-to-digital current converter as claimed in claim 1 wherein the first stage, which represents the most significant bit, comprises an inverter circuit for a bit-indication circuit.

8. An analogue-to-digital current converter as claimed in claim 7, characterized in that the direction of the reference current of the first stage can be inverted, said stage being to a switching device which connects the bit-indication circuit to the input or to the output of the inverter circuit.

9. An analogue-to-digital converter as claimed in claim 2 wherein a bit-indication circuit is connected to the first diode.

10. An analogue-to-digital current converter as claimed in claim 3 wherein a bit-indication circuit is connected to the first diode.

11. An analogue-to-digital current converter as claimed in claim 3 wherein the first stage, which represents the most significant bit, comprises an inverter circuit for a bit-indication circuit.

12. An analogue-to-digital current converter as claimed in claim 5 wherein the first stage, which represents the most significant bit, comprises an inverter circuit for a bit-indication circuit.

13. An analogue-to-digital current converter as claimed in claim 6 wherein the first stage, which represents the most significant bit, comprises an inverter circuit for a bit-indication circuit.

14. An analog-to-digital converter comprising: a plurality of stages connected in cascade for deriving a digital representation of an analog input current at an input terminal of the converter, means connecting an input of a first stage to said input terminal and an input of a second stage to an output of the first stage, an input of each stage being connected to an output of a preceding stage, each stage having a node connected to the input of that stage, to the output of that stage via a first diode, to the emitter of a first transistor connected in common-base configuration, and to a reference current source providing a reference current $I/2m^{-1}$, where I is current and m is an integer beginning with 1 for the first stage, 2 for the second stage and so on, a difference current being produced at said node between the input current to a stage and the reference current of said stage such that the emitter current of the first transistor equals the difference current when the input current is less than the reference current and the first diode conducts the difference current when the input current exceeds the reference current, and a current mirror circuit connected to a collector of the first transistor and to the output of the stage whereby the difference current flows to the output of the stage via the current mirror circuit or via the first diode depending on whether the input current of the stage is less than or greater than the reference current of said stage.

15. An analog-to-digital converter as claimed in claim 14 wherein each stage provides one bit of the digital representation in a binary weighted code, and said output current is supplied via the current mirror circuit or the first diode in mutually exclusive times.

16. An analog-to-digital converter as claimed in claim 15 wherein said current mirror circuit supplies an output current to the output of the stage when the first diode is cut-off, said output current being equal to the first transistor collector current and flowing in a direction corresponding to the forward direction of the first diode.

17. An analog-to-digital converter as claimed in claim 15 wherein the current mirror circuit comprises an operational amplifier having a first input connected to the collector of the first transistor and to an output of the operational amplifier via a first resistor and a second input connected to said operational amplifier output via a second resistor equal to the first resistor and to the output of the stage via a second diode.

18. An analog-to-digital converter as claimed in claim 17 further comprising a first bit-indication terminal coupled to the output of the operational amplifier of the first stage via an inverter circuit, and means directly coupling subsequent bit-indication terminals to respective outputs of the operational amplifiers of subsequent stages of the analog-to-digital converter.

* * * * *

UNITED STATES PATENT AND TRADEMARK OFFICE
CERTIFICATE OF CORRECTION

PATENT NO. : 4,574,270

DATED : March 4, 1986

INVENTOR(S) : RUDY J. VAN DE PLASSCHE

It is certified that error appears in the above-identified patent and that said Letters Patent is hereby corrected as shown below:

IN THE ABSTRACT, line 7, change "(a)" to --(9)--;

line 8, after "current" insert -- -mirror circuit--.

IN THE CLAIMS:

Claim 8, line 4, after "being" insert --coupled--.

Claim 14, line 12, change "I/2m$^{-1}$" to --I/2$^{m-1}$--.

Claim 17, line 2, change "15" to --14--.

Signed and Sealed this

Second Day of December, 1986

*Attest:*

DONALD J. QUIGG

*Attesting Officer*   *Commissioner of Patents and Trademarks*